(12) United States Patent
Tamura et al.

(10) Patent No.: US 11,139,291 B2
(45) Date of Patent: Oct. 5, 2021

(54) SEMICONDUCTOR DEVICE

(71) Applicant: FUJI ELECTRIC CO., LTD., Kanagawa (JP)

(72) Inventors: Takahiro Tamura, Matsumoto (JP); Yuichi Onozawa, Matsumoto (JP); Misaki Takahashi, Matsumoto (JP); Kaname Mitsuzuka, Matsumoto (JP); Daisuke Ozaki, Okaya (JP); Akinori Kanetake, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 21 days.

(21) Appl. No.: 16/699,126

(22) Filed: Nov. 29, 2019

(65) Prior Publication Data
US 2020/0098747 A1   Mar. 26, 2020

Related U.S. Application Data

(63) Continuation of application No. PCT/JP2018/039551, filed on Oct. 24, 2018.

(30) Foreign Application Priority Data

Dec. 6, 2017 (JP) .............................. JP2017-234712

(51) Int. Cl.
*H01L 27/06* (2006.01)
*H01L 29/06* (2006.01)
(Continued)

(52) U.S. Cl.
CPC ...... *H01L 27/0629* (2013.01); *H01L 29/0657* (2013.01); *H01L 29/0684* (2013.01); *H01L 29/7397* (2013.01); *H01L 29/868* (2013.01)

(58) Field of Classification Search
CPC ............ H01L 27/0629; H01L 29/0657; H01L 29/0684; H01L 29/7397
(Continued)

(56) References Cited

U.S. PATENT DOCUMENTS 10,141,304 B2   11/2018   Iwasaki
10,256,234 B2   4/2019    Tanabe
(Continued)

FOREIGN PATENT DOCUMENTS

JP   2012043891 A   3/2012
JP   2015118991 A   6/2015
(Continued)

OTHER PUBLICATIONS

International Search Report and (ISA/237) Written Opinion of the International Search Authority for International Patent Application No. PCT/JP2018/039551, mailed by the Japan Patent Office dated Jan. 15, 2019.
(Continued)

*Primary Examiner* — Igwe U Anya

(57) ABSTRACT

A semiconductor device is provided, including a semiconductor substrate, wherein the semiconductor substrate has: a diode region; a transistor region; and a boundary region that is positioned between the diode region and the transistor region, the boundary region includes a defect region that is provided: at a predetermined depth position on a front surface-side of the semiconductor substrate; and to extend from an end portion of the boundary region adjacent to the diode region toward the transistor region, at least part of the boundary region does not include a first conductivity-type emitter region exposed on a front surface of the semiconductor substrate, and the transistor region does not have the defect region below a mesa portion that is sandwiched by
(Continued)

two adjacent trench portions, and closest to the boundary region among the mesa portions having the emitter region.

11 Claims, 10 Drawing Sheets

(51) Int. Cl.
  *H01L 29/739* (2006.01)
  *H01L 29/868* (2006.01)
(58) Field of Classification Search
  USPC .......................................................... 257/140
  See application file for complete search history.

(56) References Cited

U.S. PATENT DOCUMENTS

| 10,381,225 | B2 | 8/2019 | Mukai |
| 2012/0043582 | A1 | 2/2012 | Koyama |
| 2017/0047322 | A1 | 2/2017 | Yoshida |
| 2017/0162562 | A1 | 6/2017 | Haruguchi |
| 2018/0182754 | A1* | 6/2018 | Naito .................. H01L 29/8613 |

FOREIGN PATENT DOCUMENTS

| JP | 2017041601 A | 2/2017 |
| WO | 2016080269 A1 | 5/2016 |
| WO | 2016098199 A1 | 6/2016 |
| WO | 2017047285 A1 | 3/2017 |
| WO | 2017155122 A1 | 9/2017 |

OTHER PUBLICATIONS

Office Action issued for counterpart Japanese Application No. 2019-558062, issued by the Japanese Patent Office dated Dec. 8, 2020 (drafted on Dec. 2, 2020).

* cited by examiner

SEMICONDUCTOR DEVICE

The contents of the following Japanese and PCT patent applications are incorporated herein by reference.
No. 2017-234712 filed in JP on Dec. 6, 2017 and PCT/JP2018/039551 filed on Oct. 24, 2018.

BACKGROUND

1. Technical Field

The present invention relates to a semiconductor device.

RC-IGBTs (Reverse Conducting-Insulated Gate Bipolar Transistors) having IGBT portions, and FWD (Free Wheeling Diode) portions on one semiconductor substrate are known. There is a conventionally known structure in which N+ type emitter regions, and P+ type contact regions are not provided between IGBT portions, and FWD portions (see Patent Literature 1, for example). In addition, it is known to make defect regions provided on the front surface-side of a semiconductor substrate protrude from the boundaries between IGBT regions and diode regions toward the IGBT regions (see Patent Literatures 2 to 4, for example).

PRIOR ART LITERATURES

Patent Literatures

[Patent Literature 1] WO2016/080269
[Patent Literature 2] Japanese Patent Application Publication No. 2012-43891
[Patent Literature 3] Japanese Patent Application Publication No. 2017-41601
[Patent Literature 4] WO2017/0472852

RC-IGBTs desirably have reduced conduction loss in FWD regions.

[General Disclosure]

A first aspect of the present invention provides a semiconductor device. The semiconductor device may include a semiconductor substrate. The semiconductor substrate may have a diode region; a transistor region; and a boundary region. The boundary region may be positioned between the diode region and the transistor region. The boundary region may include a defect region. The defect region may be provided at a predetermined depth position on a front surface-side of the semiconductor substrate. The defect region may extend from an end portion of the boundary region adjacent to the diode region toward the transistor region. At least part of the boundary region may not include an emitter region. The emitter region may be a first conductivity-type region exposed on a front surface of the semiconductor substrate. The defect region may be provided at a predetermined depth position on a front surface-side of the semiconductor substrate. The defect region may lie from an end portion of the boundary region adjacent to the diode region to an end portion adjacent to the transistor region. The transistor region may not have the defect region below a mesa portion that is closest to the boundary region among the mesa portions having the emitter region. The mesa portion may be a portion sandwiched by two adjacent trench portions.

One or more mesa portions which are in the boundary region, and located within an area from a predetermined position of the boundary region to an end portion adjacent to the transistor region may be first mesa portions. The first mesa portions may have a second conductivity-type contact region, and a base region having a second conductivity-type-impurity doping concentration lower than a second conductivity-type-impurity doping concentration of the contact region.

The one or more mesa portions which are in the boundary region, and located within an area from a predetermined position of the boundary region to an end portion adjacent to the diode region may be second mesa portions. The second mesa portions may be second mesa portions having the base region, and not having the contact region and the emitter region.

The boundary region may include two or more first mesa portions. In the two or more first mesa portions, a second conductivity-type-impurity doping concentration in the contact region of the first mesa portions close to the diode region may be lower than a second conductivity-type-impurity doping concentration in the contact region of the first mesa portions close to the transistor region.

All the mesa portions in the boundary region may be second mesa portions. The second mesa portions may not have the emitter region and a second conductivity-type contact region, and have a base region having a second conductivity-type-impurity doping concentration lower than a second conductivity-type-impurity doping concentration of the contact region.

The mesa portion which is in the transistor region, and is closest to the boundary region may be a second mesa portion. The second mesa portion may not have the emitter region and a second conductivity-type contact region, and have a base region having a second conductivity-type-impurity doping concentration lower than a second conductivity-type-impurity doping concentration of the contact region.

The boundary region may include one or more trench portions. The one or more trench portions may include an insulation film, and a conductive portion. The insulation film may be provided in contact with a trench. The conductive portion may be provided in contact with the insulation film. The conductive portion of each of the one or more trench portions may be electrically connected with an emitter electrode provided on the front surface of the semiconductor substrate All the mesa portions in the diode region may be second mesa portions. The second mesa portions may not have a second conductivity-type contact region exposed on the front surface of the semiconductor substrate, and have a base region having a second conductivity-type-impurity doping concentration lower than a second conductivity-type-impurity doping concentration of the contact region.

A width of the boundary region which is a length between the transistor region and the diode region may be 10 μm to 100 μm, inclusive.

The boundary region may include four to ten mesa portions.

The transistor region, and a first portion of the boundary region adjacent to the transistor region may include a first conductivity-type accumulation region. The accumulation region may be provided between a base region positioned below the emitter region, and a bottom portion of the trench portion. A second portion of the boundary region other than the first portion may not include the accumulation region.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
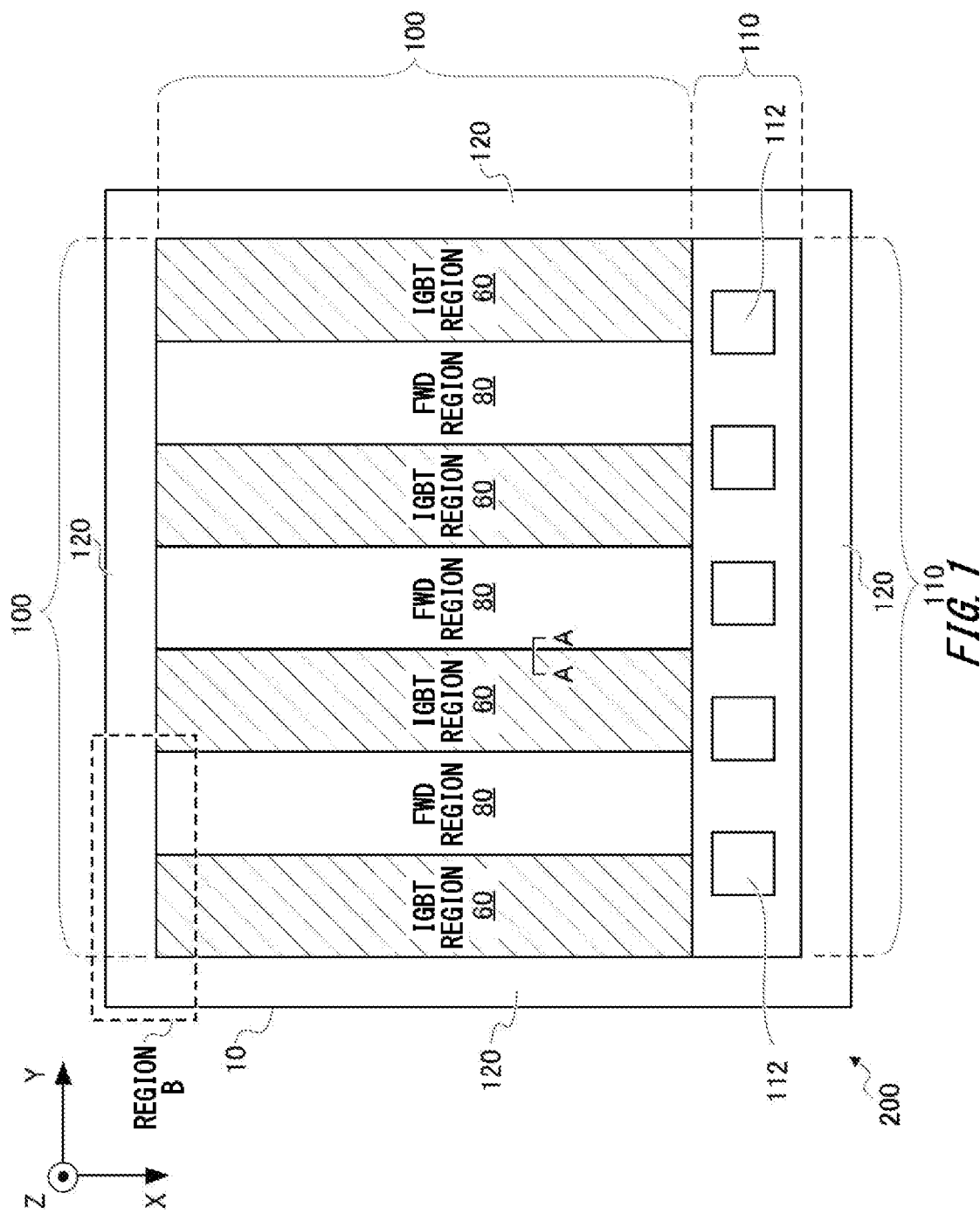
FIG. 1 is a top view of a semiconductor device 200.

FIG. 1 is a top view of a semiconductor device 200. The semiconductor device 200 in the present example has a semiconductor substrate 10. Although the semiconductor substrate 10 in the present example is a silicon substrate, the semiconductor substrate 10 may be a silicon carbide substrate in another example. The semiconductor device 200 in the present example has an active region 100, a pad region 110, and an edge termination region 120 in one semiconductor substrate 10. The pad region 110 in the present example contacts the active region 100 in the X-axis direction. In addition, the edge termination region 120 in the present example is provided to surround the active region 100, and pad region 110.

In the present specification, the X-axis direction, and Y-axis direction are orthogonal to each other, and the Z-axis direction is perpendicular to the X-Y plane. The X-axis direction, Y-axis direction, and Z-axis direction constitute a so-called right-hand system. In the present specification, the direction parallel to the Z-axis direction is called the depth direction of the semiconductor substrate 10 in some cases. In the present specification, terms related to "up" and "down" are not limited by the upward and downward directions in the direction of gravity. These terms merely refer to relative directions relative to a predetermined axis.

The active region 100 in the present example has IGBT regions 60 including transistors such as IGBTs, and FWD regions 80 including diodes such as FWDs. That is, the semiconductor device 200 in the present example is an RC-IGBT semiconductor device. The IGBT regions 60 are exemplary transistor regions, and the FWD regions 80 are exemplary diode regions. The IGBT regions 60, and FWD regions 80 in the present example each have a stripe-like shape that is longer in the X-axis direction than in the Y-axis direction. The IGBT regions 60, and FWD regions 80 may be arranged alternately in the Y-axis direction. In the present example, IGBT regions 60 are arranged at the both end portions of the active region 100 in the Y-axis direction.

The pad region 110 may have a plurality of electrode pads 112. The plurality of electrode pads 112 may be a gate pad, a cathode electrode pad, an anode electrode pad, and the like. The gate pad may be connected with an external terminal. The external terminal may transmit gate signals to gate conductive portions of the IGBT regions 60 via the gate pad. The cathode electrode pad, and anode electrode pad may be connected to the cathode, and anode of a temperature-sensing diode provided in the active region 100, respectively. The edge termination region 120 may have a function of relaxing electric field concentration on the front surface-side of the semiconductor substrate 10. The edge termination region 120 may have any of a guard ring, a field plate, and a RESURF, or a structure obtained by combining them.

Figure 2:
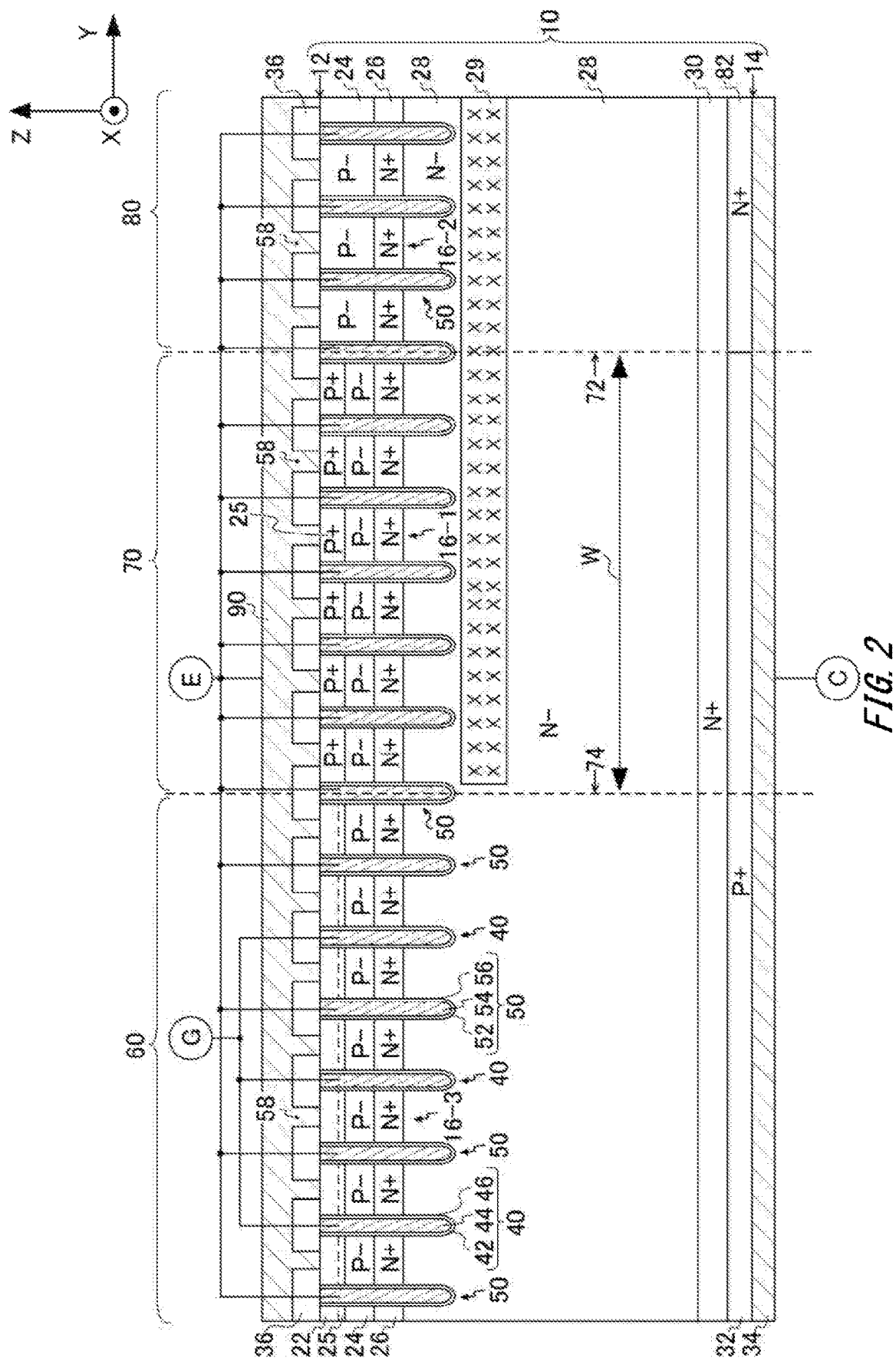
FIG. 2 is a cross-sectional view taken along A-A in FIG. 1 according to a first embodiment.

FIG. 2 is a cross-sectional view taken along A-A in FIG. 1 according to a first embodiment. The A-A cross-section is a cross-section parallel to the Y-Z plane. The A-A cross-section passes through a P+ type contact region 25 in an IGBT region 60. It should be noted however that, for the purpose of facilitating understanding, the lower end of an N+ type emitter region 22 is indicated by a broken line in the contact region 25 in FIG. 2.

The semiconductor device 200 in the present example has the semiconductor substrate 10, an interlayer dielectric film 36, an emitter electrode 90, and a collector electrode 34. The emitter electrode 90 is provided on a front surface 12 of the semiconductor substrate 10, and on the interlayer dielectric film 36. The interlayer dielectric film 36 may be formed of one or more types of material among silicon dioxide ($SiO_2$), BPSG (Boro-Phospho Silicate Glass), PSG (Phosphorus Silicate Glass), and BSG (Borosilicate Glass). The interlayer dielectric film 36 in the present example is a laminate of a silicon dioxide layer, and a BPSG layer.

The emitter electrode 90 may be electrically connected with dummy conductive portions 54 of dummy trench portions 50 through contact portions 58 which are opening portions provided in the interlayer dielectric film 36. The material of the emitter electrode 90 may be aluminum (Al), may be an aluminum (Al)-silicon (Si) alloy, or may be an aluminum (Al)-nickel (Ni) alloy. Note that plugs containing tungsten (W) may be provided in the opening portions of the interlayer dielectric film 36, and the dummy conductive portions 54, and the emitter electrode 90 may be electrically connected via the plugs. In addition, the front surface 12 of the semiconductor substrate 10, and the emitter electrode 90 may also be electrically connected via the plugs similarly.

The semiconductor device 200 in the present example has a gate metal layer electrically connected to gate conductive portions 44. It should be noted however that the gate metal layer is omitted in FIG. 2, and the presence of the gate metal layer is simply indicated by character G. The gate metal layer may transmit a gate potential from the gate pad to the gate conductive portions 44. In addition, the collector electrode 34 in the present example is provided in contact with a rear surface 14 of the semiconductor substrate 10. The material of the collector electrode 34 may be Al, an Al—Si alloy, or an Al—Ni alloy.

The semiconductor substrate 10 has: gate trench portions 40; the dummy trench portions 50, an N+ type emitter region 22; the P+ type contact region 25; a P− type base region 24; an N+ type accumulation region 26; a defect region 29; an N− type drift region 28; an N+ type buffer region 30; a P+ type collector region 32; and an N+ type cathode region 82. In the present example, N type is an exemplary first conductivity-type, and P type is an exemplary second conductivity-type. Note that in another example, N type may be the second conductivity-type, and P type may be the first conductivity-type. In addition, in the present example, N and P mean that electrons and holes are the majority carriers, respectively. In addition, N and P with symbols + and − mean that the carrier concentrations are higher and lower than N and P without those symbols, respectively.

Each gate trench portion 40 in the present example has a gate trench insulation film 42, a gate conductive portion 44, and a gate trench 46. The gate trench insulation film 42 may be provided in contact with the inner wall of the gate trench 46. The gate trench insulation film 42 may be formed by oxidizing or nitriding a semiconductor at the inner wall of the gate trench 46. The gate conductive portion 44 in the present example is provided in contact with the gate trench insulation film 42, and on the inner side relative to the gate trench insulation film 42. The gate trench insulation film 42 may insulate the gate conductive portion 44 from the semiconductor substrate 10. The gate conductive portion 44 may be formed of a conductive material such as polysilicon. Each dummy trench portion 50 in the present example has a dummy trench insulation film 52, a dummy conductive portion 54, and a dummy trench 56. The dummy trench insulation film 52, and dummy conductive portion 54 may be formed by a technique similar to that for formation of the gate trench insulation film 42, and gate conductive portion 44.

The gate trench portions 40, and dummy trench portions 50 are provided separately from each other at predetermined intervals in the Y-axis direction. The gate trench portions 40, and dummy trench portions 50 may penetrate the base region 24, and accumulation region 26, and reach the drift region 28. If a predetermined gate voltage is applied to a gate conductive portion 44, a channel is formed in a region which is in the base region 24, and is near the interface in contact with the corresponding gate trench 46.

In the present example, regions of the semiconductor substrate 10, each region of which is from a bottom portion of a trench portion to the front surface 12, and is sandwiched by two adjacent trench portions, are referred to as mesa portions 16. Each mesa portion 16 may be sandwiched by a dummy trench portion 50 and a gate trench portion 40 in the Y-axis direction, and may be sandwiched by two dummy trench portions 50 in the Y-axis direction. In addition, each mesa portion 16 may be sandwiched by two gate trench portions 40. The mesa portions 16 include mesa portions 16-1, 16-2, and 16-3. Each mesa portion 16 may have at least the accumulation region 26, and base region 24.

In the present example, P type-impurities are ion-implanted on the front surface 12-side so as to form the base region 24. Subsequently, N type-impurities are ion-implanted on the front surface 12-side so as to form the accumulation region 26 in a predetermined area deeper than the base region 24. In the present example, the base region 24, and accumulation region 26 are provided over an entire IGBT region 60, boundary region 70, and FWD region 80. In the depth direction, the accumulation region 26 may be positioned between the base region 24, and bottom portions of trench portions. The accumulation region 26 in the present example is positioned between the base region 24, and portions of the drift region 28 positioned higher than the bottom portions of the trench portions. Note that, in the present example, the gate trench portions 40, and dummy trench portions 50 are collectively referred to as trench portions in some cases.

In the present example, subsequently, N type- and P type-impurities are selectively ion-implanted on the front surface 12-side so as to form the emitter region 22, and contact region 25 each exposed on the front surface 12. Therefore, the base region 24 may be positioned below the emitter region 22, and contact region 25. Note that the P type-impurity doping concentration of the base region 24 may be lower than the P type-impurity doping concentration of the contact region 25.

At least part of the boundary region 70 may not have the emitter region 22. More specifically, the emitter region 22 may not be provided in mesa portions 16 in the boundary region 70 closer to the FWD region 80. If the N+ type emitter region 22 is provided in the boundary region 70, especially in a first mesa portion 16-1 adjacent to the FWD region 80, some of electrons flowing in the FWD region 80 in the Z-axis positive-direction may be extracted into the boundary region 70. Extraction of electrons into the boundary region 70 results in conduction loss in the FWD region 80. Since the emitter region 22 is not provided in the boundary region 70 in the present example, conduction loss in the FWD region 80 can be reduced as compared with the case where the emitter region 22 is provided in the boundary region 70. The emitter region 22, and contact region 25 in the present example are provided selectively only in the IGBT region 60. That is, all mesa portions 16 in the boundary region 70 in the present example are first mesa portions 16-1 that do not have the emitter region 22, but have the contact region 25.

In addition, all mesa portions 16 in the FWD region 80 in the present example illustrated in FIG. 2 are second mesa portions 16-2 that do not have the emitter region 22, and contact region 25, but have the base region 24 exposed on the front surface 12. In contrast to this, all mesa portions 16 in the IGBT region 60 in the present example are third mesa portions 16-3 that have the emitter region 22, and contact region 25.

In the present specification, the IGBT region 60 is an imaginary projected region that appears on the front surface 12 if the collector region 32 is imaginarily projected onto the front surface 12 from the rear surface 14 in a direction parallel to the Z-axis direction, and includes a region where predetermined unit configurations each including both the N+ type emitter region 22, and P+ type contact region 25 are arranged regularly on the X-Y plane. In addition, in the present specification, the IGBT region 60 includes the gate trench portions 40. In the present specification, a Y-axis-direction end portion of the IGBT region 60 is positioned at a dummy trench portion 50 which is among dummy trench portions 50 adjacent to a gate trench portion 40 provided closest to the FWD region 80 in the Y-axis direction and is on a side closer to the FWD region 80. In the present example, the Y-axis-direction end portion of the IGBT region 60 is at the Y-axis direction center of the dummy trench portion 50.

In the present specification, the FWD region 80 includes an imaginary projected region that appears on the front surface 12 if the cathode region 82 is imaginarily projected onto the front surface 12 from the rear surface 14 in a direction parallel to the Z-axis direction. The FWD region 80 may be, in the Y-axis direction, an imaginary projected region that appears on the front surface 12 if the cathode region 82 is imaginarily projected onto the front surface 12 from the rear surface 14 in a direction parallel to the Z-axis direction. In addition, the FWD region 80 in the present specification includes dummy trench portions 50. If gate trench portions 40, and dummy trench portions 50 are provided in the IGBT region 60, and dummy trench portions 50 are not provided in the FWD region 80, the etching rate in the boundary region 70 may be different from that in the IGBT region 60, and FWD region 80 at the time of trench etching for forming gate trenches 46, and dummy trenches 56. In contrast to this, by providing dummy trench portions 50 in the FWD region 80 in the present example, variations in the shapes of trench portions can be reduced as compared with the case where dummy trench portions 50 are not provided therein. Thereby, it is advantageous in that it is possible to ensure that there is uniformity in terms of the shapes of trench portions in the IGBT region 60, boundary region 70, and FWD region 80. Note that the FWD region 80 in the present example has neither the emitter region 22 nor the contact region 25. It should be noted however that, in another example, the FWD region 80 may have the contact region 25 at its end portions in the X-axis direction. In the present specification, a Y-axis-direction end portion of the FWD region 80 is positioned at the boundary between the N+ type cathode region 82, and P+ type collector region 32 which are near the rear surface 14. In the present example, the boundary between the cathode region 82 and the P+ type collector region 32 is also the Y-axis direction center of a dummy trench portion 50 positioned at the Y-axis-direction end portion of the FWD region 80.

In the present specification, the boundary region 70 is a region between the IGBT region 60 and the FWD region 80. One end of the boundary region 70 in the Y-axis direction may be in contact with the IGBT region 60, and the other end of the boundary region 70 in the Y-axis direction may be in contact with the FWD region 80. In the boundary region 70 in the present example, there is the collector region 32 on a side of the semiconductor substrate 10 closer to the rear surface 14. The width W of the boundary region 70 in the Y-axis direction (i.e., the length from an end portion 72 adjacent to the FWD region 80 to an end portion 74 adjacent to the IGBT region 60) may be 10 μm to 100 μm, inclusive, and may be 50 μm to 100 μm, inclusive.

The thickness of the semiconductor substrate 10 may be determined according to the withstand voltage of the semiconductor device 200, and the width of the boundary region 70 in the Y-axis direction may be determined according to the thickness of the semiconductor substrate 10. Specifically, the higher the withstand voltage of the semiconductor device 200 is, the larger the width of the boundary region 70 in the Y-axis direction may be. In addition, the width of the boundary region 70 in the Y-axis direction may be determined based on how carriers flow in the semiconductor substrate 10, and the amount of carriers in the semiconductor substrate 10. Specifically, the larger the amount of carriers that flow between the IGBT region 60 and the FWD region 80 per unit time is, the larger the width of the boundary region 70 in the Y-axis direction may be. In addition, the larger the amount of carriers in the semiconductor substrate 10 is, the larger the width of the boundary region 70 in the Y-axis direction may be.

The boundary region 70 may have four to ten mesa portions 16. The width of one mesa portion 16 in the Y-axis direction may be about 10 μm. The length of four mesa portions 16 sandwiching three trench portions in the Y-axis direction may be 50 μm, and the length of five mesa portions 16 sandwiching four trench portions in the Y-axis direction may be 50 μm. In addition, the length of eight mesa portions 16 sandwiching seven trench portions in the Y-axis direction may be 100 μm, and the length of ten mesa portions 16 sandwiching nine trench portions in the Y-axis direction may be 100 μm.

By providing the boundary region 70 having a structure different from those of the IGBT region 60, and FWD region 80 in the present example, interference of current between the IGBT region 60 and the FWD region 80 can be reduced. In one embodiment, the larger the width of the boundary region 70 in the Y-axis direction is, the more significant the effect of reducing interference of current can be.

It should be noted however that as the width of the boundary region 70 in the Y-axis direction increases, the area in the semiconductor substrate 10 that can be used as the IGBT region 60, and FWD region 80 decreases. This issue becomes particularly noticeable if a plurality of IGBT regions 60, and a plurality of FWD regions 80 are provided in one semiconductor substrate 10. In view of this, in the present example in which IGBT regions 60, and FWD regions 80 are provided alternately in the Y-axis direction, the number of mesa portions 16 in the boundary region 70 is desirably no greater than ten, or the length of them is desirably no greater than 100 μm. Thereby, reduction of the area of the IGBT regions 60, and FWD regions 80 due to the boundary regions 70 can be suppressed, while at the same time interference of current between the IGBT regions 60 and the FWD regions 80 is surely reduced.

The boundary region 70 may have one or more dummy trench portions 50. All trench portions provided in the boundary region 70 in the present example are dummy trench portions 50. If gate trench portions 40, and dummy trench portions 50 are provided in the IGBT region 60, and dummy trench portions 50 are not provided in the boundary region 70, the etching rate in the FWD region 80 may be different from that in the IGBT region 60, and boundary region 70 at the time of trench etching. In contrast to this, by providing trench portions in the boundary region 70 in the present example, variations in the shapes of trench portions can be reduced as compared with the case where trench portions are not provided therein. Thereby, it is advantageous in that it is possible to ensure that there is uniformity in terms of the trench shapes in the IGBT region 60, boundary region 70, and FWD region 80.

The defect region 29 may be provided over the entire boundary region 70, and FWD region 80. The defect region 29 may be provided in semiconductor substrate 10, and closer to the front surface 12 than the center position between the front surface 12 and the rear surface 14 is. The defect region 29 may have point defects (vacancies, divacancies, dangling bonds, etc.) formed inside the semiconductor substrate 10 by introducing impurities such as helium (He). In addition, the defect region 29 may have impurities themselves introduced to form point defects. The defect region 29 may have carrier recombination centers formed by point defects and/or impurities in the semiconductor substrate 10.

The defect region 29 is also called a lifetime killer region or a lifetime control region. Since it becomes difficult for electrons to move from the FWD region 80 to the IGBT region 60 by providing the defect region 29 in the FWD region 80, conduction loss in the FWD region 80 can be reduced. In addition, by providing the defect region 29, reverse recovery time of the FWD region 80 can be made short, reverse recovery charge can be reduced, and also reverse recovery peak current can be reduced.

The IGBT region 60 may not have the defect region 29 below a mesa portion 16-3 closest to the boundary region 70 among the mesa portions 16-3 having the emitter region 22. The IGBT region 60 in the present example does not have the defect region 29 at any of its portions. The defect region 29 is formed by implanting helium or the like from the front surface 12 after a gate structure is formed, for example. By covering the IGBT region 60 with a mask material, it is possible to not form the defect region 29 in the IGBT region 60, but to form the defect region 29 only in the boundary region 70, and FWD region 80. Therefore, not providing the defect region 29 below the mesa portion 16 in the IGBT region 60 closest to the boundary region 70 may mean not providing the defect region 29 in the IGBT region 60 at any of its portions.

If the defect region 29 is provided in the IGBT region 60, damage is caused to gate trench insulation films 42, and the gate threshold voltage ($V_{th}$) may deviate from a design value in some cases. In the present example, the area where the defect region 29 is formed does not go over the boundary region 70, and FWD region 80 at most, and the defect region 29 is not formed in the IGBT region 60. Thereby, deviation of the gate threshold voltage from a design value can be suppressed as compared with the case where the defect region 29 is formed in the IGBT region 60. Furthermore, since gate trench portions 40 are not provided in the boundary region 70 in the present example, the possibility of causing damage to gate trench insulation films 42 due to the defect region 29 being provided in the IGBT region 60, and of affecting the long-term reliability of the gate withstand voltage can be eliminated.

In the Z-axis direction, the buffer region 30 may be positioned between the drift region 28, and the collector region 32, and cathode region 82. The buffer region 30 may have a function of preventing a depletion layer spreading from a bottom portion of the base region 24 to the rear surface 14 from reaching the collector region 32 at the time of turn-on/off of the semiconductor device 200. The buffer region 30 may be a field stop region where the N type doping concentration has discrete peak values in the depth direction.

Figure 3:
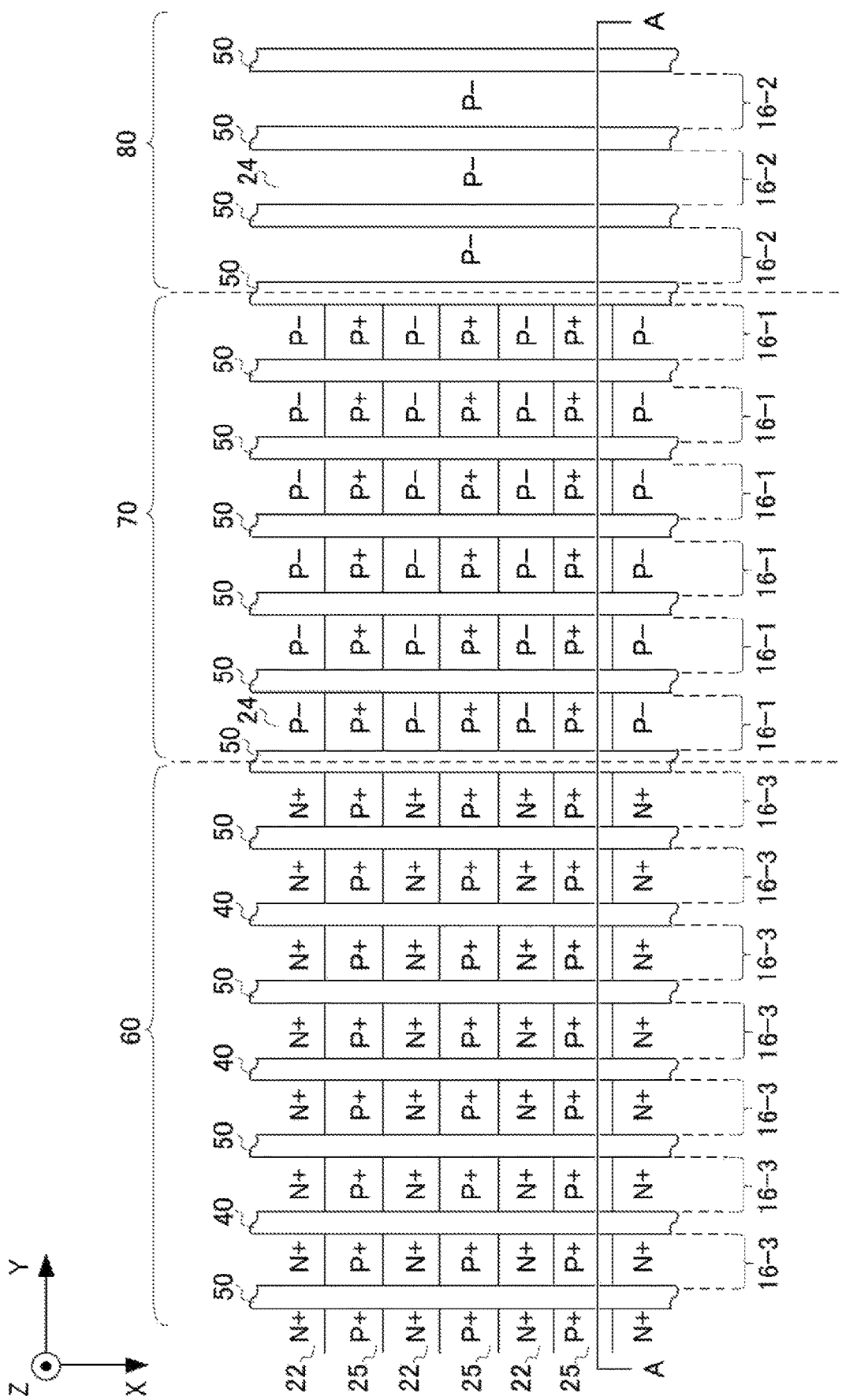
FIG. 3 is an enlarged top view of a portion near A-A in FIG. 1.

FIG. 3 is an enlarged top view of a portion near A-A in FIG. 1. Note that the interlayer dielectric film 36, and emitter electrode 90 are omitted in FIG. 3 for facilitating understanding. Gate trench portions 40, and dummy trench portion 50 may extend in the X-axis direction. As mentioned above, the IGBT region 60 in the present example has mesa portions 16-3. In the mesa portions 16-3 in the present example, the emitter region 22, and contact region 25 are exposed on the front surface 12 alternately in the X-axis direction.

In addition, the boundary region 70 in the present example has first mesa portions 16-1. Since the emitter region 22 is not provided in the first mesa portions 16-1, the base region 24, and contact region 25 are exposed on the front surface 12 alternately in the X-axis direction. The FWD region 80 in the present example has mesa portions 16-2. Since the emitter region 22, and contact region 25 are not provided in the mesa portions 16-2 in the present example, only the base region 24 is exposed on the front surface 12.

Figure 4:
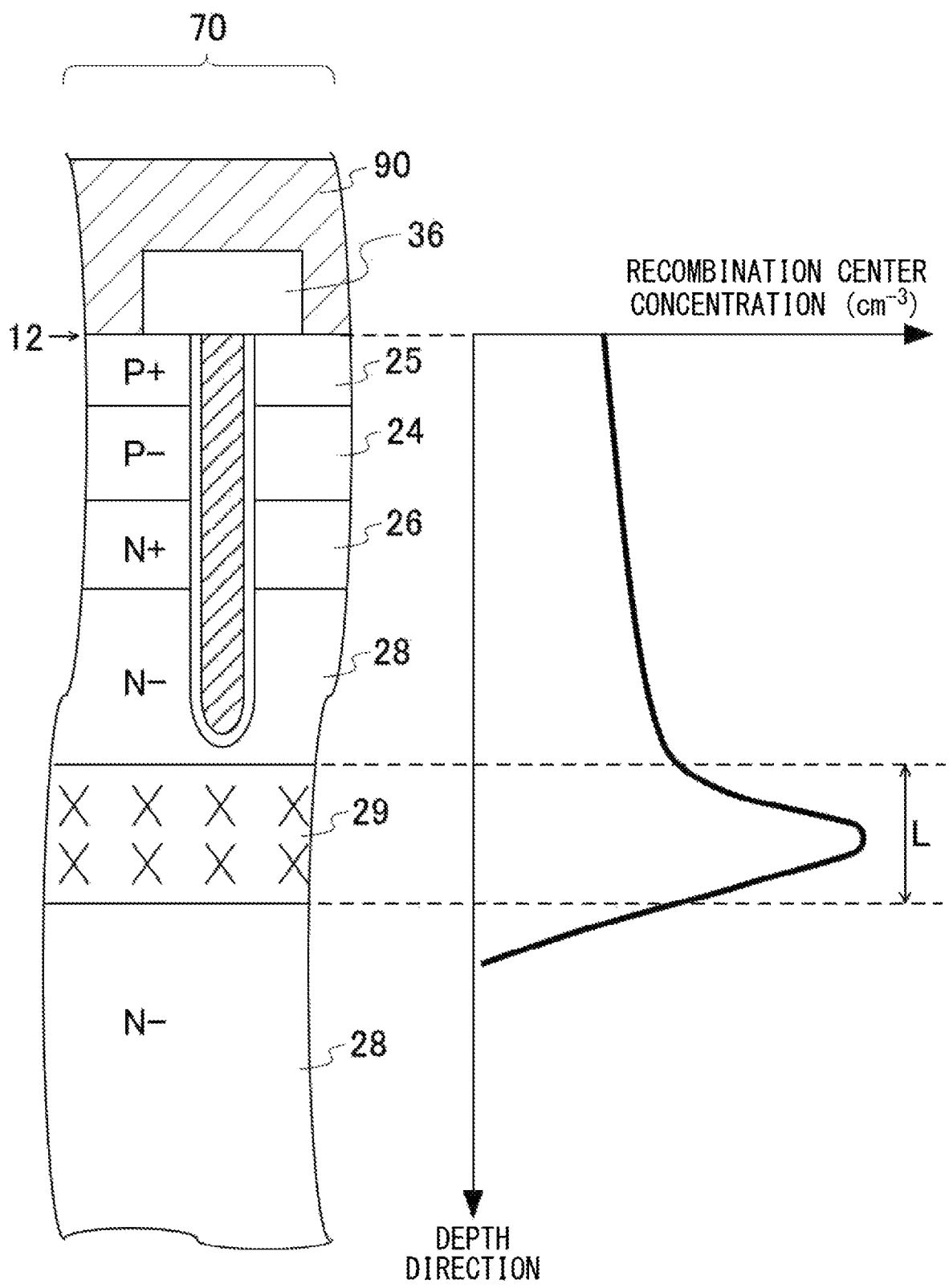
FIG. 4 is a figure illustrating a recombination center concentration distribution in a defect region 29.

FIG. 4 is a figure illustrating a recombination center concentration distribution in the defect region 29. The horizontal axis corresponds to the recombination center concentration ($cm^{-3}$), and the vertical axis corresponds to the depth in the semiconductor substrate 10. The defect region 29 may have a local maximum (peak) of the recombination center concentration distribution at a predetermined depth position on the front surface 12-side. The peak of the recombination center concentration distribution may be at a position where the point defect density concentration distribution shows a local maximum, or may be at a position where the concentration distribution of impurities such as helium shows a local maximum. In addition, the peak of the recombination center concentration distribution may be at a position where the combined concentration distribution of point defect density and impurity concentration shows a local maximum. In addition, the length L of the defect region 29 in the depth direction may be the full width at half maximum of the recombination center peak concentration.

Figure 5:
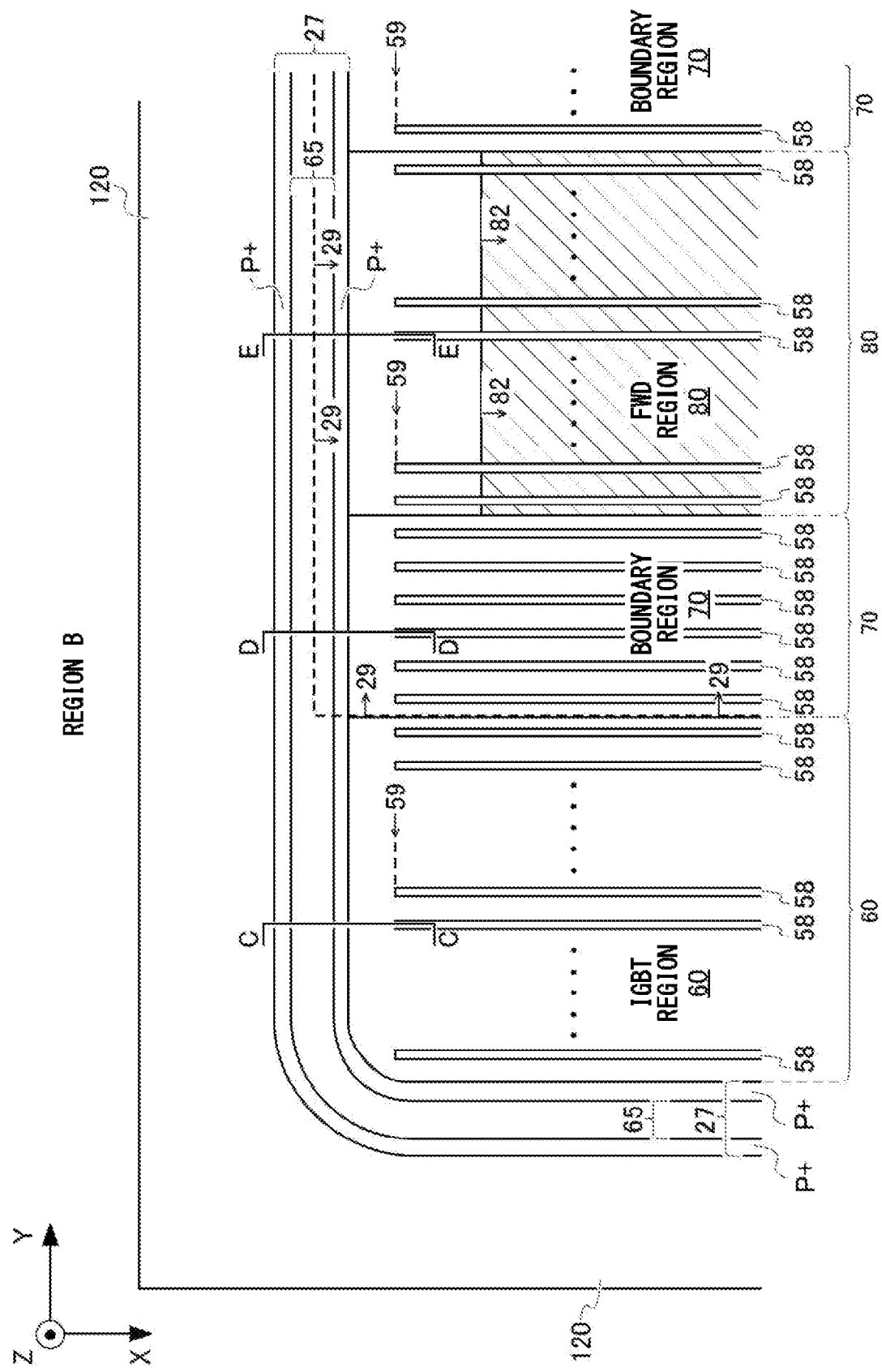
FIG. 5 is an enlarged view of a region B in FIG. 1.

FIG. 5 is an enlarged view of a region B in FIG. 1. The region B includes a gate runner 65 provided between the active region 100, and the edge termination region 120. The gate runner 65 may be a conductive polysilicon layer containing a dopant. The gate runner 65 may be provided to surround the active region 100 on the X-Y plane. Note that, in consideration of the visibility of the figure, the emitter electrode 90, a gate metal layer 66 mentioned below, and a passivation film on the emitter electrode 90, and gate metal layer 66 are omitted in FIG. 5.

Below the gate runner 65, the semiconductor substrate 10 has a P+ type well region 27 that lies from the front surface 12 to a predetermined depth position. A bottom portion of the well region 27 may be deeper than gate trench portions 40, and may be shallower than the defect region 29. Even if parts of the gate trench portions 40 positioned at end portions of the active region 100 are provided in the well region 27, channels are not formed in the well region 27. Therefore, the gate trench portions 40 positioned at the well region 27 may not function as gate trench portions 40. Note that, similar to the gate runner 65, the well region 27 may also be provided to surround the active region 100.

The region B includes an IGBT region 60, boundary regions 70, and an FWD region 80 each positioned near an end portion in the X-axis negative-direction. Although mesa portions 16 are omitted in the region B for the purpose of facilitating understanding, contact portions 58 positioned on mesa portions 16 are illustrated. It should be noted however that an illustration of a plurality of contact portions 58 is omitted in the IGBT region 60, and FWD region 80. In the IGBT region 60, boundary regions 70, and FWD region 80, the shapes of contact portions 58 may be the same. The contact portions 58 in the present example have rectangular shapes with longer sides extending in the X-axis direction, and shorter sides extending in the Y-axis direction.

The N+ type cathode region 82 may be provided in part of the FWD region 80. In FIG. 5, the area where the cathode region 82 is provided is indicated by diagonal lines. An outer end portion of the cathode region 82 (in the X-axis negative-direction in FIG. 5) may be provided on the inner side relative to end portions 59 of the contact portions 58 (in the X-axis positive-direction in FIG. 5). The FWD region 80 may include the P+ type collector region 32 in an area on the X-Y plane which is different from the cathode region 82, and in the same depth area as the cathode region 82. It should be noted however that, in the present specification, a portion in contact with the cathode region 82 in the X-axis direction is also treated as the FWD region 80.

The defect region 29 may be provided in both part of the boundary region 70, and part of the FWD region 80. In FIG. 5, the outline of the defect region 29 is indicated by broken lines. In the present example, in the Y-axis direction, the defect region 29 is provided over the entire boundary region 70, and FWD region 80. However, in the boundary region 70, the defect region 29 may better lie from an end portion adjacent to the FWD region 80 toward the IGBT region 60, at a predetermined depth position in the semiconductor substrate 10 on its front surface-side. In addition, in the X-axis direction, the defect region 29 may not be provided near the gate runner 65. An outer end portion of the defect region 29 in the X-axis direction may be provided on the inner side relative to the end portions 59 of the contact portions 58, and the outer side relative to an end portion of the cathode region 82 in the X-axis direction.

Figure 6:
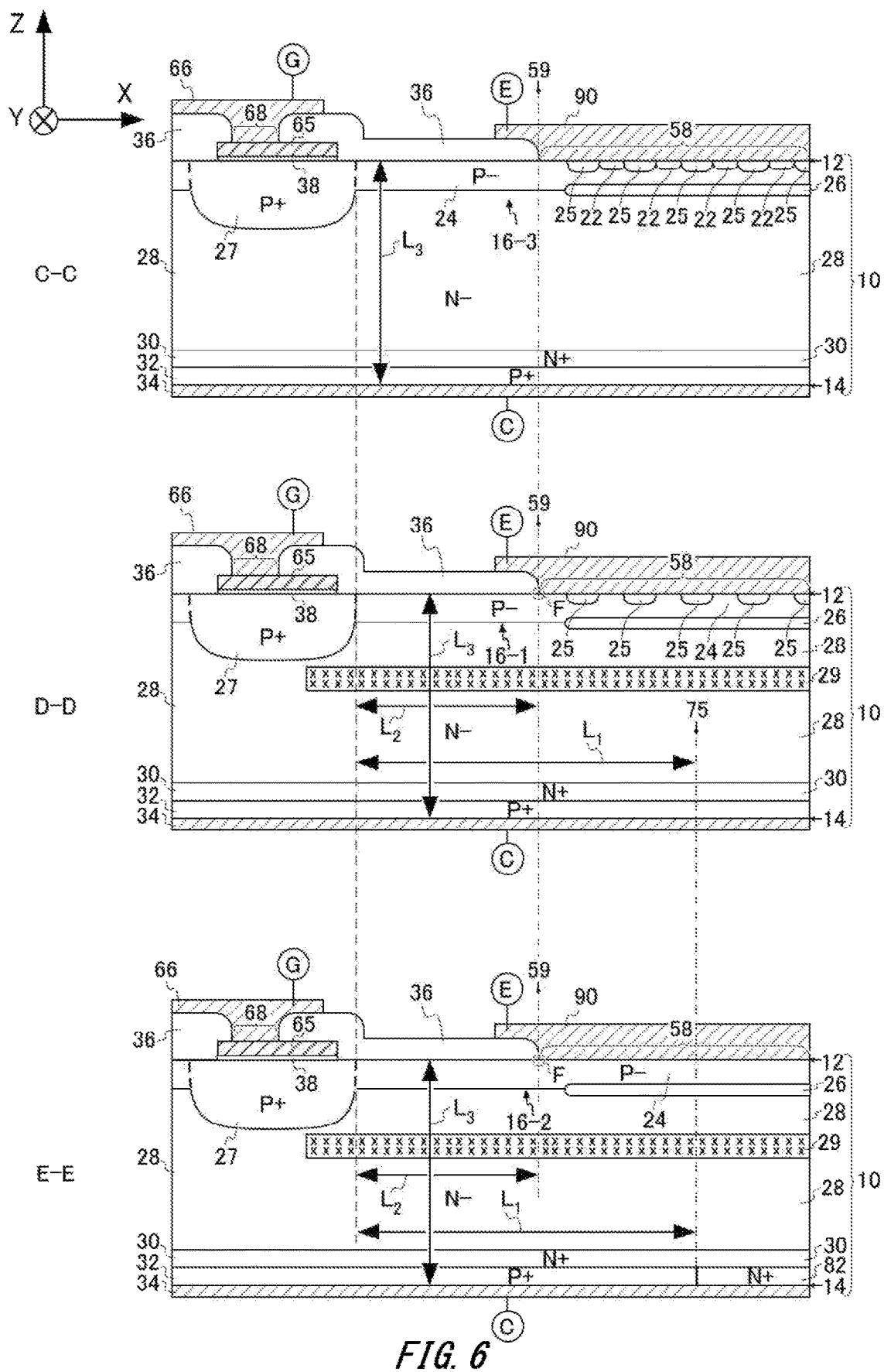
FIG. 6 illustrates cross-sectional views taken along C-C, D-D, and E-E in FIG. 5.

FIG. 6 illustrates cross-sectional views taken along C-C, D-D, and E-E in FIG. 5. The C-C cross-section passes through a contact portion 58 in the IGBT region 60, the D-D cross-section passes through a contact portion 58 in the boundary region 70, and the E-E cross-section passes through a contact portion 58 in the FWD region 80.

An insulation film 38 such as an oxide film may be provided between the gate runner 65 and the front surface 12. Thereby, the gate runner 65, and semiconductor substrate 10 may be electrically insulated from each other. The interlayer dielectric film 36 provided on the gate runner 65 may have a plurality of opening portions. The interlayer dielectric film 36 includes a contact portion 68 which is an opening portion to provide a connection between the gate metal layer 66 and the gate runner 65, and contact portions 58 which are opening portions to provide connections between the emitter electrode 90 and the front surface 12. Outer end portions 59 of the contact portions 58 may be separated from an inner end portion of the well region 27 by a predetermined length.

A gate metal layer 66 may extend in the Y-axis direction. The gate metal layer 66 may have a width in the X-axis direction. The gate metal layer 66 may be electrically connected to the gate runner 65 via the contact portion 68 provided in the interlayer dielectric film 36. The gate runner 65 may also extend in the Y-axis direction. The gate runner 65 may also have a width in the X-axis direction. Note that FIG. 6 illustrates widths of the gate runner 65, and gate metal layer 66 in the X-axis direction. The gate runner 65 may overlap gate trench portions 40 on the well region 27. At positions where it overlaps the gate trench portions 40, the gate runner 65 may be electrically connected with gate conductive portions 44. Note that FIG. 6 does not illustrate connections between the gate metal layer 66 and the gate conductive portions 44. The gate metal layer 66, and emitter electrode 90 are provided separately from each other by a predetermined distance on the interlayer dielectric film 36, and are electrically separated from each other.

As illustrated in the C-C cross-section, the IGBT region 60 has the P+ type collector region 32. If a gate signal corresponding to an ON voltage ($V_{on}$) is applied to the gate conductive portions 44 via the gate metal layer 66, an ON current ($I_{on}$) flows from the collector electrode 34 to the emitter electrode 90.

As illustrated in the E-E cross-section, the FWD region 80 has the P+ type collector region 32, in addition to the N+ type cathode region 82. In the present example, there is a length $L_1$ between an X-axis positive-direction end portion of the well region 27 to a boundary 75 between the collector region 32 and the cathode region 82.

The diode (FWD) in the FWD region 80 in the present example is connected in anti-parallel with the transistor (IGBT) in the IGBT region 60. The anode of the diode, and the emitter of the transistor are both electrically connected to the emitter electrode 90, and the cathode of the diode, and the collector of the transistor are both electrically connected to the collector electrode 34.

When an ON voltage is being applied to gate conductive portions 44 (i.e., the transistor is in the ON state), current does not flow in the FWD region 80. However, when a voltage lower than the ON voltage is being applied to the gate conductive portions 44 (i.e., the transistor is in the OFF state), current may flow in the FWD region 80. For example, if the transistor is in the OFF state, a free wheeling current flows in the diode from the emitter electrode 90 to the collector electrode 34. Subsequently, a reverse recovery current flows from the collector electrode 34 to the emitter electrode 90 (i.e., the direction in which the free wheeling current flows is reversed). Still subsequently, the free wheeling current decreases gradually to be close to zero.

A carrier (holes in the present example) may be accumulated in the well region 27 due to an ON current ($I_{on}$) of the IGBT region 60 or the like. The holes accumulated in the well region 27 flow from the well region 27 to contact portions 58 on mesa portions 16-2 when a reverse recovery current flows. In particular, since holes are concentrated at end portions 59 of contact portions 58, electric field concentration easily occurs there. For the purpose of facilitating understanding, in the E-E cross-section, a portion of a contact portion 58 which is most easily subjected to electric field concentration is indicated as a region F.

A length $L_2$ from an X-axis positive-direction end portion of the well region 27 to an end portion 59 of a contact portion 58 may be greater than zero. For example, the length $L_2$ is 40% to 60%, inclusive, of the length $L_1$. In addition, for example, the length $L_2$ is 10 μm to 20 μm, inclusive. By making the distance between the well region 27 and the end portion 59 sufficiently long, excessive carrier injection from the well region 27 into contact portions 58 can be suppressed at the time of reverse recovery, as compared with the case where the length $L_2=0$. Therefore, electric field concentration at the region F can be reduced, and the breakdown withstand capability of the semiconductor device 200 can be improved.

It should be noted however that since if end portions 59 of contact portions 58 are positioned on the inner side relative to the boundary 75 (i.e., if $L_1<L_2$), the length of the cathode region 82 in the X-axis direction becomes longer than the length of the contact portions 58 in the X-axis direction, it becomes easier for holes accumulated in the well region 27 to flow into the cathode region 82, and conduction loss in the FWD region 80 may increase. Therefore, the end portions 59 are preferably positioned on the outer side relative to the boundary 75 (i.e., $L_2<L_1$). Thereby, conduction loss in the FWD region 80 can be reduced.

As illustrated in the D-D cross-section, the boundary region 70 does not have the cathode region 82, but has the P+ type collector region 32 similar to the IGBT region 60. It should be noted however that since the boundary region 70 is in contact with the FWD region 80, it becomes easier for holes to be concentrated when a reverse recovery current flows in the FWD region 80 as the distances between the FWD region 80 and contact portions 58 decrease. Additionally, it becomes easier for holes to be concentrated when a reverse recovery current flows in the FWD region 80 as the distance from the well region 27 decreases (e.g., in the region F in a contact portion 58).

In the present example, there is the length $L_2$ from the X-axis positive-direction end portion of the well region 27 to end portions 59 of contact portions 58 also in the boundary region 70. Therefore, excessive carrier injection from the well region 27 can be suppressed also in the boundary region 70. Additionally, since electric field concentration in the region F can be reduced, the breakdown withstand capability of the semiconductor device 200 at the time of reverse recovery operation can be improved.

In the present example, the length from the front surface 12 of the semiconductor substrate 10 to its rear surface 14 is $L_3$. That is, the thickness of the semiconductor substrate 10 is the length $L_3$. The length $L_2$ between the well region 27 and the contact portion 58 may be shorter than the length $L_3$ ($L_2<L_3$), and may be shorter than a half of the length $L_3$ ($L_2<(L_3/2)$). Thereby, the risk of causing reverse recovery breakdown can be lowered while at the same time conduction loss in the FWD region 80 is reduced. Note that the length $L_2$ may be greater than the length $L_1$ ($L_1<L_2$) in another example. In one embodiment, the length $L_2$ is 50 μm, and the length $L_1$ is 10 μm. Note that the length $L_1$ may be greater than the depth of the well region 27. If $L_1<L_2$, the conduction loss increases, but the breakdown withstand capability at the time of reverse recovery operation can be improved further.

In the C-C, D-D, and E-E cross-sections in the present example, the positions of end portions 59 of contact portions 58 in the X-axis direction are the same. It should be noted however that, in another example, the positions of end portions 59 in the FWD region 80 in the X-axis direction may be provided on the inner side (in the X-axis positive-direction in FIG. 6) relative to the positions of end portions 59 in the IGBT region 60 in the X-axis direction. In addition, the positions of end portions 59 in the boundary region 70, and FWD region 80 in the X-axis direction may be provided on the inner side relative to the positions of end portions 59 in the IGBT region 60 in the X-axis direction. Thereby, the breakdown withstand capability of the semiconductor device 200 at the time of reverse recovery operation can be improved further.

The defect region 29 extends in the X-axis direction, but may not reach end portions of the semiconductor substrate 10, and terminate below the well region 27. By making the defect region 29 not extend to reach end portions of the semiconductor substrate 10, leakage current can be suppressed, and the reliability of the semiconductor device can be improved as compared with the case where the defect region 29 extends to reach end portions of the semiconductor substrate 10. It should be noted however that the defect region 29 may be positioned on the outer side (in the X-axis negative-direction in FIG. 6) relative to an X-axis negative-direction end portion of the well region 27 as long as the defect region 29 does not reach end portions of the semiconductor substrate 10. A peak of the recombination center concentration distribution in the defect region 29 may be positioned below the well region 27. Part of the defect region 29 may be provided in the well region 27.

Figure 7:
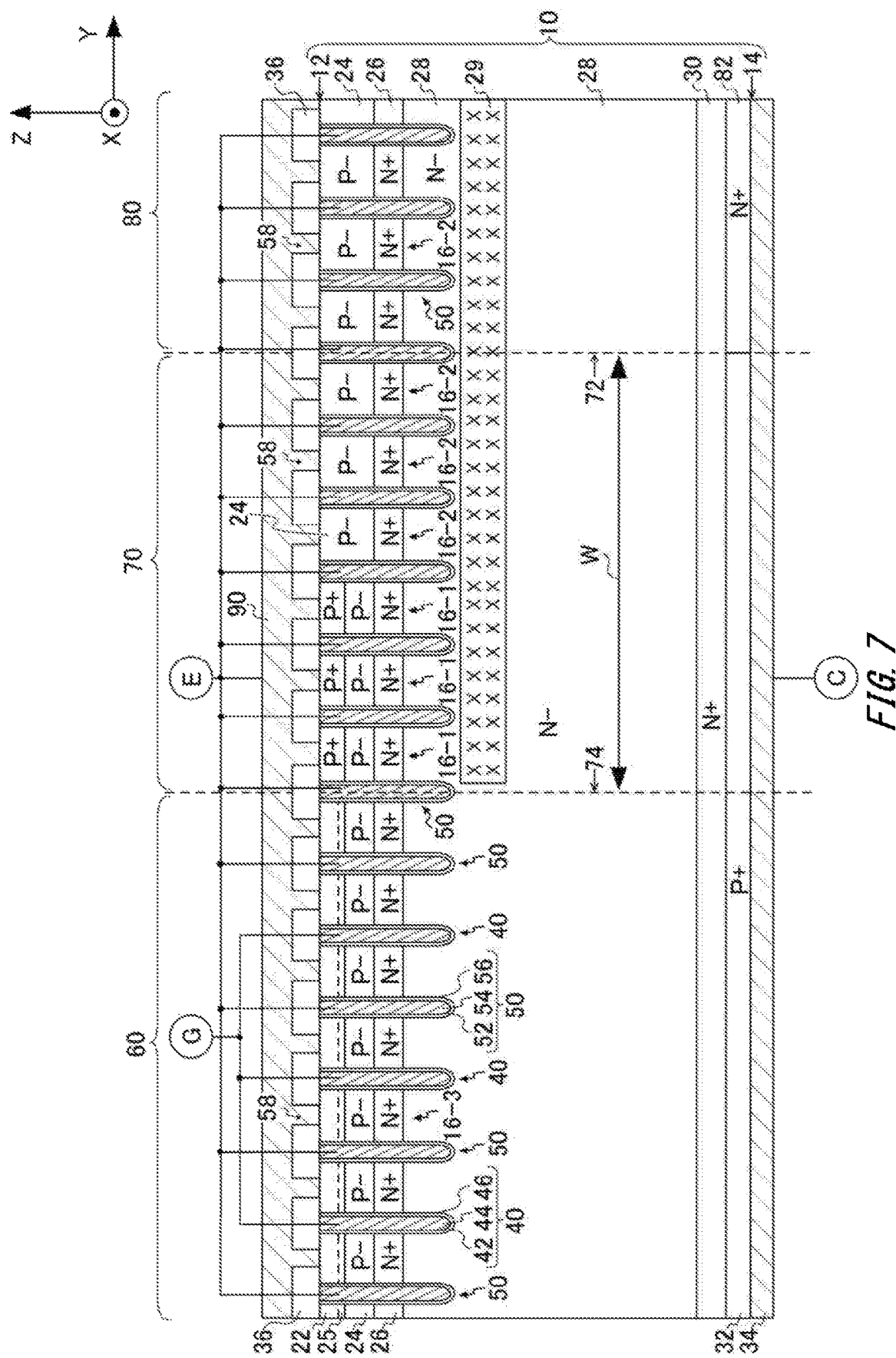
FIG. 7 is a cross-sectional view taken along A-A in FIG. 1 according to a second embodiment.

FIG. 7 is a cross-sectional view taken along A-A in FIG. 1 according to a second embodiment. In the boundary region 70 in the present example, one or more mesa portions 16 in an area from a predetermined position in the boundary region 70 (i.e., the Y-axis direction middle dummy trench portion 50) to an end portion 74 adjacent to the IGBT region 60 are first mesa portions 16-1. In addition, in the boundary region 70 in the present example, one or more mesa portions 16 in an area from the predetermined position in the boundary region 70 (i.e., the Y-axis direction middle dummy trench portion 50) to an end portion 72 adjacent to the FWD region 80 are second mesa portions 16-2. The boundary region 70 in the present example has six mesa portions 16. Among the six mesa portions 16, three mesa portions 16 closer to the IGBT region 60 are first mesa portions 16-1, and three mesa portions 16 closer to the FWD regions 80 are second mesa portions 16-2. This is a difference from the first embodiment.

If the P+ type contact region 25 is provided in the boundary region 70, especially in a first mesa portion 16-1 adjacent to the FWD region 80, the contact region 25 may introduce holes into the FWD region 80. The holes introduced from the boundary region 70 into the FWD region 80 may increase reverse recovery current at the time of reverse recovery of the FWD region 80. Thereby, reverse recovery loss in the FWD region 80 may increase. In contrast to this, since the contact region 25 is not provided in mesa portions 16 closer to the FWD region 80 in the present example, reverse recovery loss can be reduced as compared with the case where the contact region 25 is provided in those mesa portions 16. Note that although three first mesa portions 16-1 are provided closer to the IGBT region 60 in the present example, the boundary region 70 may have two or more first mesa portions 16-1 having the contact region 25. In this case, the two or more mesa portions 16 closer to the IGBT region 60 may be first mesa portions 16-1, and the remaining mesa portions 16 closer to the FWD region 80 may be second mesa portions 16-2. Note that aspects of FIG. 5 and FIG. 6 may be applied also to the second embodiment.

Figure 8:
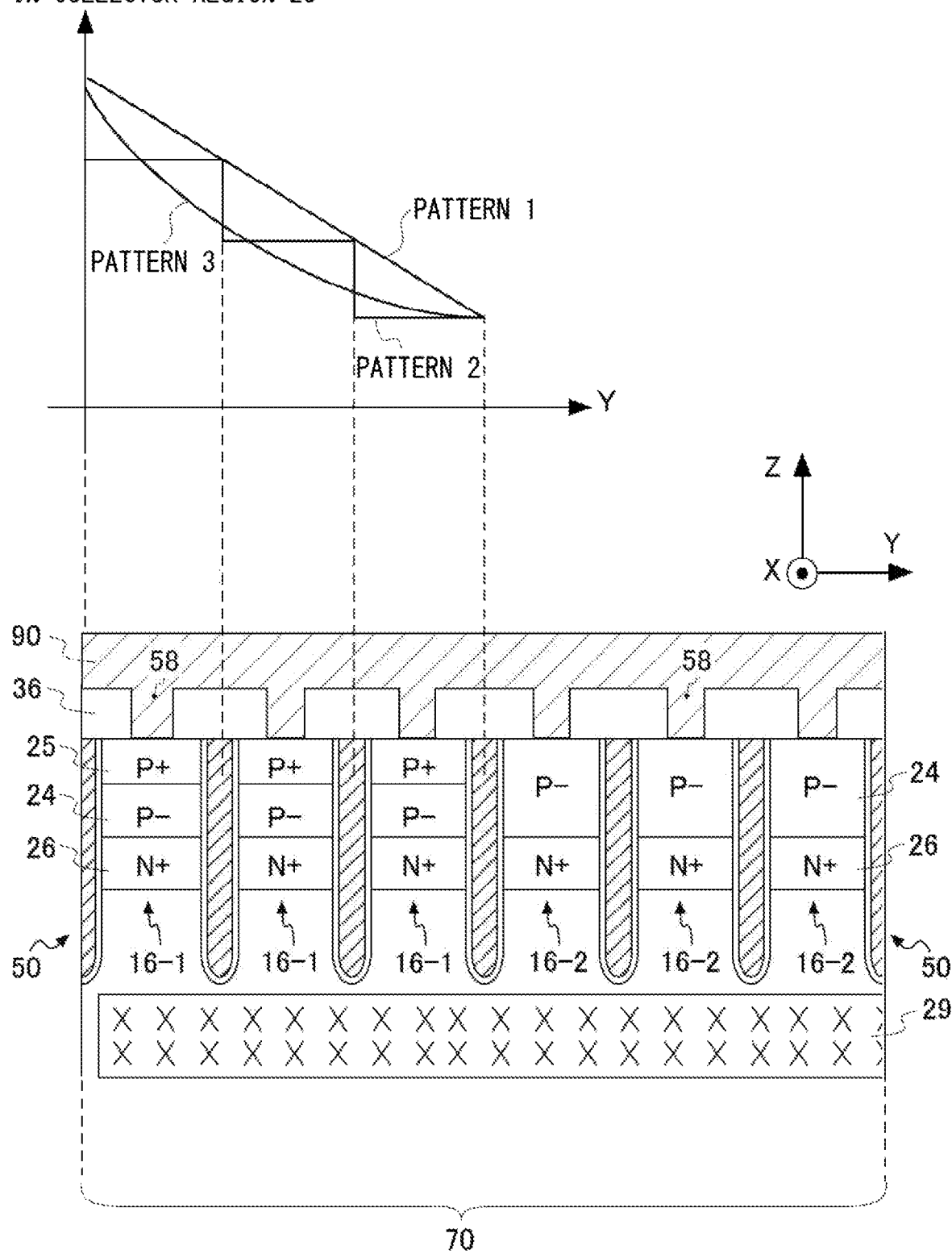
FIG. 8 is a figure illustrating a P type-impurity doping concentration distribution in a contact region 25 in a boundary region 70 according to a third embodiment.

FIG. 8 is a figure illustrating a P type-impurity doping concentration distribution in the contact region 25 in the boundary region 70 according to a third embodiment. For the purpose of facilitating understanding, the lower half of the figure illustrates the boundary region 70, and the upper half of the figure illustrates the P type-impurity doping concentration distribution in the contact region 25. In the doping concentration distribution in the contact region 25, the horizontal axis corresponds to the Y-axis direction, and the vertical axis corresponds to the P type-impurity doping concentration. Note that, in consideration of visibility of FIG. 8, the P type-impurity concentration distribution is illustrated as a distribution continuous in the Y-axis direction. It should be noted however that since the P type-impurities implanted into the contact region 25 are not present in dummy trench portions 50, the concentration distribution may be discontinuous at the dummy trench portions 50.

Similar to the second embodiment, the boundary region 70 in the present example has three first mesa portions 16-1 positioned closer to the IGBT region 60, and three second mesa portions 16-2 positioned closer to the FWD region 80. The P type-impurity doping concentration in the contact region 25 of first mesa portions 16-1 close to the FWD region 80 may be lower than the P type-impurity doping concentration in the contact region 25 of first mesa portions 16-1 close to the IGBT region 60.

For example, about the three first mesa portions 16-1 positioned closer to the IGBT region 60, the P type-impurity concentration decreases linearly as the distance from the IGBT region 60 in the Y-axis positive-direction increases (pattern 1). In addition, in another example, the P type-impurity concentration decreases stepwise as the distance from the IGBT region 60 in the Y-axis positive-direction increases (pattern 2). Furthermore, in another example, the P type-impurity concentration decreases exponentially as the distance from the IGBT region 60 in the Y-axis positive-direction increases (pattern 3). In any of the examples, the P type-impurity concentration can be adjusted by adjusting the thickness in the Z-axis direction of a resist mask used when the P type-impurities are ion-implanted.

In the present example, holes to be introduced into the FWD region 80 can be reduced further as compared with the second embodiment by lowering the P type-impurity concentration of portions of the contact region 25 that are closer to the FWD region 80 as compared with that of portions of the contact 25 that are closer to the IGBT region 60. Thereby, reverse recovery loss can be reduced further as compared with the second embodiment. Note that aspects of FIG. 5 and FIG. 6 may be applied also to the third embodiment.

Figure 9:
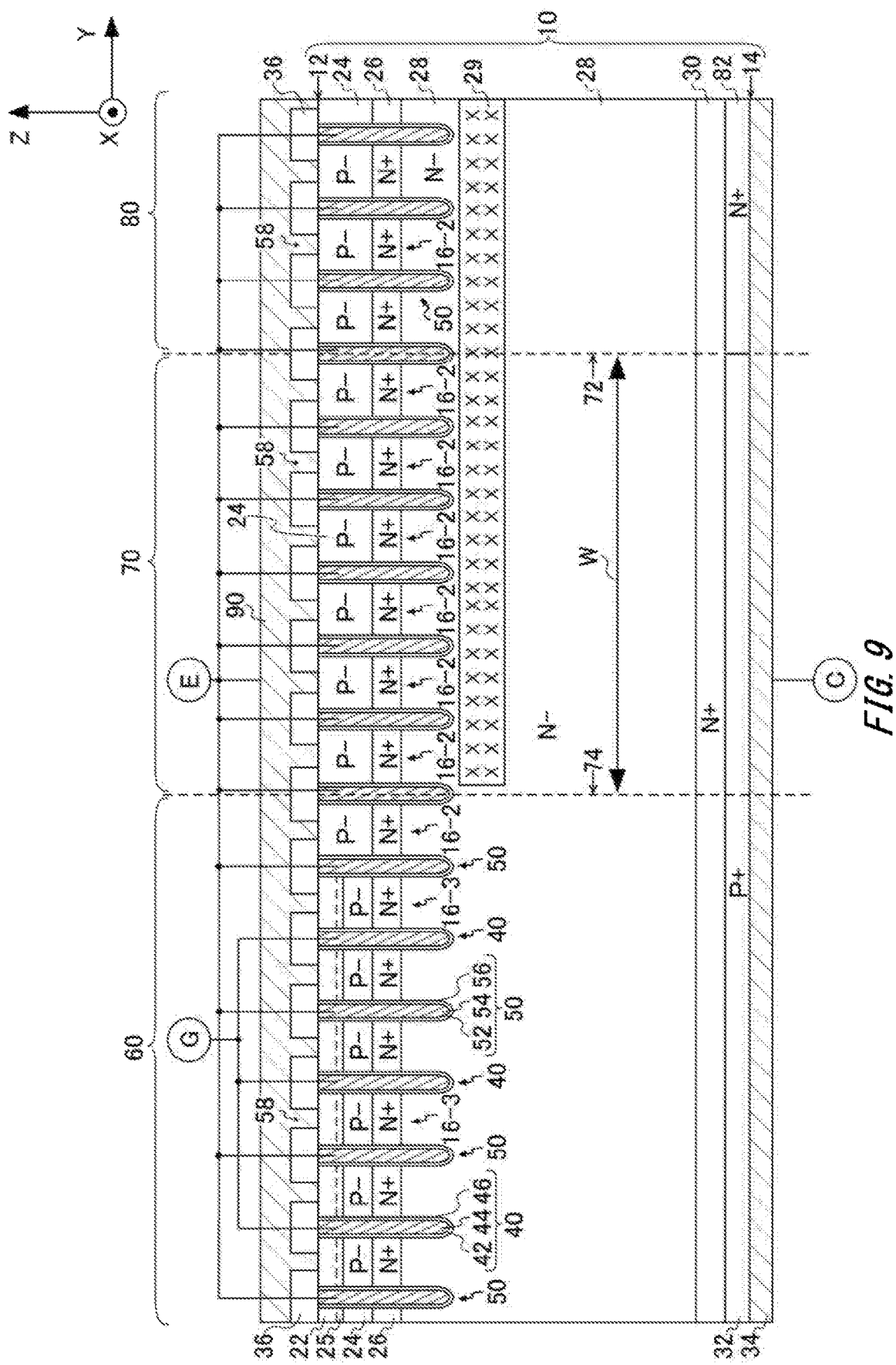
FIG. 9 is a cross-sectional view taken along A-A in FIG. 1 according to a fourth embodiment.

FIG. 9 is a cross-sectional view taken along A-A in FIG. 1 according to a fourth embodiment. All mesa portions 16 in the boundary region 70 may be second mesa portions 16-2.

In addition, a mesa portion 16 which is in the IGBT region 60, and is closest to the boundary region 70 may also be a second mesa portion 16-2. This is a difference of the present example from the embodiments mentioned above. Reverse recovery loss on a side closer to the FWD region 80 can be reduced further in the present example, as compared with the second embodiment. In addition, since extraction of electrons is not performed also in the mesa portion 16 in the IGBT region 60 and closest to the boundary region 70 in addition to the boundary region 70, conduction loss in the FWD region 80 can be reduced further as compared with the first embodiment. Note that aspects of FIG. 5 and FIG. 6 may be applied also to the fourth embodiment.

Although the mesa portion 16 which is in the IGBT region 60 and is closest to the boundary region 70 is configured as a second mesa portion 16-2 in the present example, a plurality of mesa portions 16 which are in the IGBT region 60, and are closer to the boundary region 70 may be configured as second mesa portions 16-2. That is, the emitter region 22, and contact region 25 may not be included in a plurality of mesa portions 16 which are in the IGBT region 60, and are closer to the boundary region 70.

Figure 10:
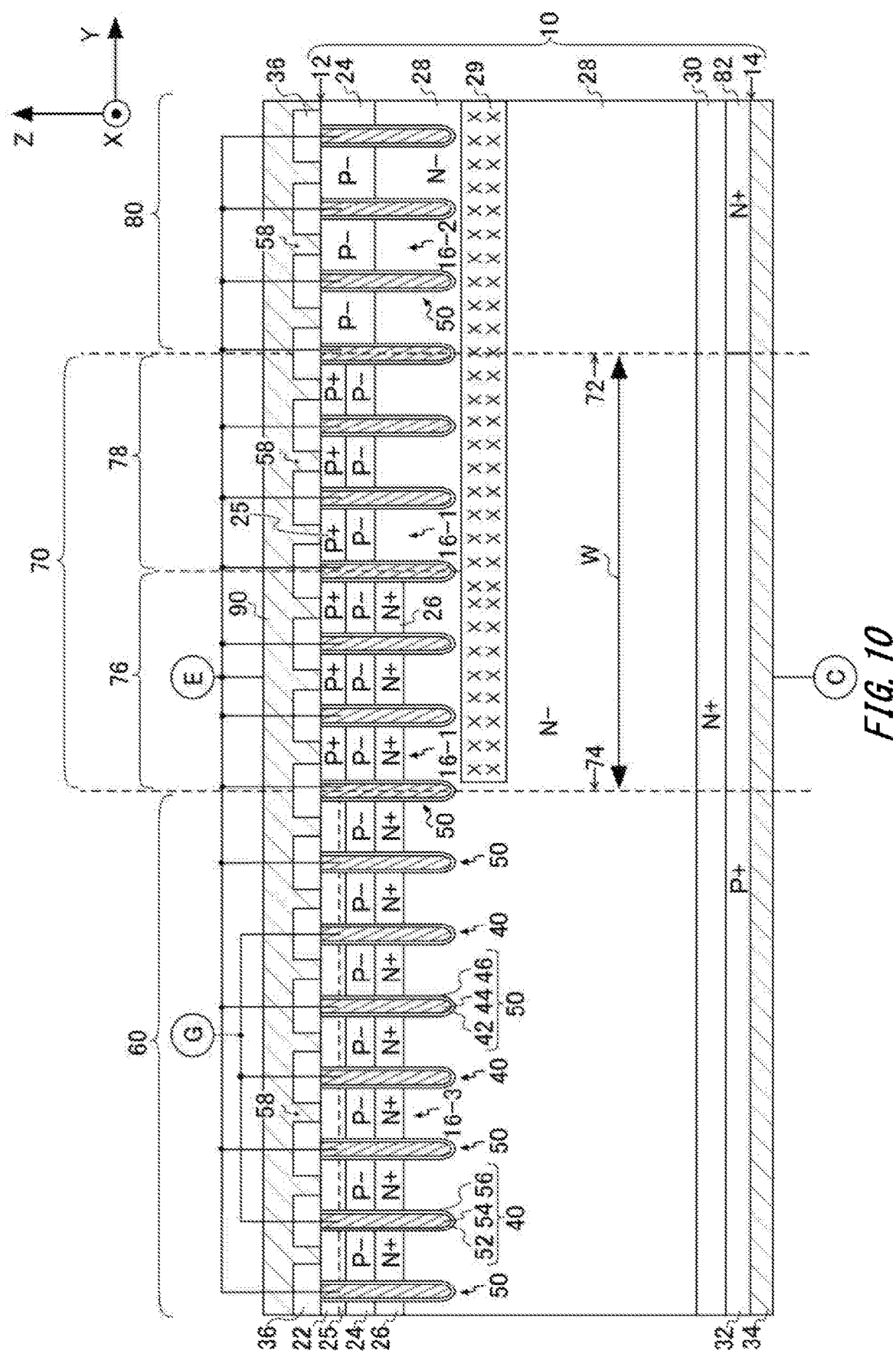
FIG. 10 is a cross-sectional view taken along A-A in FIG. 1 according to a fifth embodiment.

FIG. 10 is a cross-sectional view taken along A-A in FIG. 1 according to a fifth embodiment. The present example is different from the embodiments mentioned above in terms of the arrangement of the accumulation region 26. The boundary region 70 in the present example has a first portion 76 adjacent to the IGBT region 60, and a second portion 78 which is a portion adjacent to the FWD region 80, and excluding the first portion 76. In the present example, the IGBT region 60, and the first portion 76 of the boundary region 70 have the accumulation region 26. It should be noted however that the second portion 78 of the boundary region 70, and the FWD region 80 do not have the accumulation region 26.

In the IGBT region 60, the N+ type accumulation region 26 has a function of temporarily accumulating holes introduced from the collector region 32 toward the front surface 12. Since the carrier injection enhancement effect (IE effect) can be enhanced thereby, the ON voltage ($V_{on}$) in the IGBT region 60 can be lowered as compared with the case where the accumulation region 26 is not provided.

Since the accumulation region 26 is not provided in the second portion 78 of the boundary region 70 in the present example, holes introduced from the collector region 32 toward the front surface 12 can be promptly expelled to the emitter electrode 90. Therefore, the number of holes accumulated the boundary region 70 can be reduced as compared with the case where the accumulation region 26 is provided over the entire boundary region 70. Since the number of holes introduced from the boundary region 70 into the FWD region 80 can be reduced thereby, reverse recovery loss in the FWD region 80 can be reduced. Aspects of FIG. 5 and FIG. 6 may be applied also to the fifth embodiment.

Note that the first portion 76 may have one or more first mesa portions 16-1, and the second portion 78 may have one or more second mesa portions 16-2. In addition, the first portion 76, and second portion 78 may also have second mesa portions 16-2. In this manner, the accumulation region 26 in the present example may be applied also to the second embodiment to fourth embodiment.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 12: front surface; 14: rear surface; 16: mesa portion; 22: emitter region; 24: base region; 25: contact region; 26: accumulation region; 27: well region; 28: drift region; 29: defect region; 30: buffer region; 32: collector region; 34: collector electrode; 36: interlayer dielectric film; 38: insulation film; 40: gate trench portion; 42: gate trench insulation film; 44: gate conductive portion; 46: gate trench; 50: dummy trench portion; 52: dummy trench insulation film; 54: dummy conductive portion; 56: dummy trench; 58: contact portion; 59: end portion; 60: IGBT region; 65: gate runner; 66: gate metal layer; 68: contact portion; 70: boundary region; 72: end portion; 74: end portion; 75: boundary; 76: first portion; 78: second portion; 80: FWD region; 82: cathode region; 90: emitter electrode; 100: active region; 110: pad region; 112: electrode pad; 120: edge termination region; 200: semiconductor device

What is claimed is:

1. A semiconductor device comprising a semiconductor substrate, wherein
the semiconductor substrate has:
a diode region;
a transistor region; and
a boundary region that is positioned between the diode region and the transistor region, and is in contact with the transistor region,
the boundary region includes a defect region that is provided: at a predetermined depth position on a front surface-side of the semiconductor substrate; and to extend from an end portion of the boundary region adjacent to the diode region toward the transistor region,
the boundary region does not include a first conductivity-type emitter region exposed on a front surface of the semiconductor substrate, and
the transistor region does not have the defect region below a mesa portion that is sandwiched by two adjacent trench portions, and closest to the boundary region among the mesa portions having the first conductivity-type emitter region, wherein
the mesa portion, which is in the transistor region and is closest to the boundary region, is a second mesa portion not having the first conductivity-type emitter region and a second conductivity-type contact region, and having a base region having a second conductivity-type-impurity doping concentration lower than a second conductivity-type-impurity doping concentration of the second conductivity-type contact region.

2. The semiconductor device according to claim 1, wherein one or more mesa portions which are in the boundary region, and located within an area from a predetermined position of the boundary region to an end portion adjacent to the transistor region are first mesa portions having the second conductivity-type contact region, and the base region having a second conductivity-type-impurity doping concentration lower than a second conductivity-type-impurity doping concentration of the second conductivity-type contact region.

3. The semiconductor device according to claim 2, wherein the one or more mesa portions which are in the boundary region, and located within an area from a predetermined position of the boundary region to an end portion adjacent to the diode region are second mesa portions having the base region, and not having the second conductivity-type contact region and the first conductivity-type emitter region.

4. The semiconductor device according to claim 1, wherein all the mesa portions in the boundary region are second mesa portions not having the first conductivity-type emitter region and the second conductivity-type contact region, and having the base region having a second conductivity-type-impurity doping concentration lower than a second conductivity-type-impurity doping concentration of the second conductivity-type contact region.

5. The semiconductor device according to claim 1, wherein
the boundary region includes one or more trench portions including an insulation film provided in contact with a trench, and a conductive portion provided in contact with the insulation film, and
the conductive portion of each of the one or more trench portions is electrically connected with an emitter electrode provided on the front surface of the semiconductor substrate.

6. The semiconductor device according to claim 1, wherein all the mesa portions in the diode region are second mesa portions not having the second conductivity-type contact region exposed on the front surface of the semiconductor substrate, and having the base region having a second conductivity-type-impurity doping concentration lower than a second conductivity-type-impurity doping concentration of the second conductivity-type contact region.

7. The semiconductor device according to claim 1, wherein
the diode region, and the transistor region are arranged next to each other in a first direction, and
all the mesa portions in the diode region do not have the second conductivity-type contact region exposed on the front surface of the semiconductor substrate in regions of the mesa portions other than end portions in a second direction perpendicular to the first direction.

8. The semiconductor device according to claim 1, wherein a width of the boundary region which is a length between the transistor region and the diode region is 10 μm to 100 μm, inclusive.

9. The semiconductor device according to claim 1, wherein the boundary region includes four to ten mesa portions.

10. The semiconductor device according to claim 1, wherein
the transistor region, and a first portion of the boundary region adjacent to the transistor region include a first conductivity-type accumulation region provided between a base region positioned below the first conductivity-type emitter region, and a bottom portion of the trench portion, and
a second portion of the boundary region other than the first portion does not include the accumulation region.

11. A semiconductor device comprising a semiconductor substrate comprising
the semiconductor substrate that has:
a diode region;
a transistor region; and
a boundary region that is positioned between the diode region and the transistor region, and is in contact with the transistor region,
the boundary region includes a defect region that is provided: at a predetermined depth position on a front surface-side of the semiconductor substrate; and to extend from an end portion of the boundary region adjacent to the diode region toward the transistor region,
the boundary region does not include a first conductivity-type emitter region exposed on a front surface of the semiconductor substrate,
the transistor region does not have the defect region below a mesa portion that is sandwiched by two adjacent trench portions, and closest to the boundary region among the mesa portions having the first conductivity-type emitter region, and
wherein one or more mesa portions which are in the boundary region, and located within an area from a predetermined position of the boundary region to an end portion adjacent to the transistor region are first mesa portions having a second conductivity-type contact region, and a base region having a second conductivity-type-impurity doping concentration lower than a second conductivity-type-impurity doping concentration of the second conductivity-type contact region, and
the boundary region includes two or more first mesa portions, and
in the two or more first mesa portions, a second conductivity-type-impurity doping concentration in the second conductivity-type contact region of the first mesa portions close to the diode region is lower than a second conductivity-type-impurity doping concentration in the second conductivity-type contact region of the first mesa portions close to the transistor region.

* * * * *